United States Patent
Takei et al.

(10) Patent No.: US 8,587,190 B2
(45) Date of Patent: Nov. 19, 2013

(54) ILLUMINATION DEVICE HAVING IMPROVED VISUAL PERCEPTION OF A SKIN COLOR

(75) Inventors: Naoko Takei, Osaka (JP); Kouji Nishioka, Tottori (JP); Sayaka Yamaguchi, Kyoto (JP); Takashi Saito, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/567,220

(22) Filed: Aug. 6, 2012

(65) Prior Publication Data

US 2013/0044456 A1 Feb. 21, 2013

(30) Foreign Application Priority Data

Aug. 18, 2011 (JP) ................. 2011-179077

(51) Int. Cl.
*F21V 9/16* (2006.01)
*C09K 11/00* (2006.01)

(52) U.S. Cl.
USPC .......................... 313/503; 313/502; 362/84

(58) Field of Classification Search
USPC .................... 313/501–503; 362/84
See application file for complete search history.

(56) References Cited

U.S. PATENT DOCUMENTS

| 5,684,359 | A | 11/1997 | Yano et al. |
| 2006/0045832 | A1 | 3/2006 | Nagatomi et al. |
| 2009/0267485 | A1* | 10/2009 | Nagatomi et al. ............ 313/503 |
| 2010/0127282 | A1 | 5/2010 | Harbers et al. |
| 2012/0104317 | A1* | 5/2012 | Nagatomi et al. ..... 252/301.6 R |
| 2012/0104448 | A1 | 5/2012 | Yoshimura et al. |

FOREIGN PATENT DOCUMENTS

| JP | S58-42944 | 3/1983 |
| JP | H8-55610 | 2/1996 |
| JP | H11-258047 | 9/1999 |
| JP | 2006/0045832 | 3/2006 |
| JP | 2006-310817 | 11/2006 |
| JP | 2008-258356 | 10/2008 |
| JP | 2010-176992 | 8/2010 |
| WO | 2011/002087 | 1/2011 |

OTHER PUBLICATIONS

Extended European Search Report for corresponding European Application No. 12005705.4-1226 mailed Jan. 2, 2013.

* cited by examiner

*Primary Examiner* — Karabi Guharay
(74) *Attorney, Agent, or Firm* — Renner, Otto, Boisselle & Sklar, LLP

(57) ABSTRACT

An illumination device includes an irradiation unit having a light emitting element and fluorescent bodies excited by the light from the light emitting element to radiate light of different wavelengths. The irradiation unit irradiates composite light of blue, green and red lights having half value widths of 20-40 nm, 110-150 nm and 80-110 nm and peak wavelengths of 440-465 nm, 545-555 nm and 630-650 nm, respectively. If the output value of the light in a wavelength 435-465 nm is assumed to be 100%, the output values of the lights having wavelengths of 490, 530 and 639 nm fall within 46-56%, 59-77% and 75-93%, respectively. The ratio of the output value of the light of 630 nm to that of the light of 530 nm falls within 73-86%.

5 Claims, 3 Drawing Sheets

FIG. 3

| BLUE LIGHT | GREEN LIGHT | | RED LIGHT | | COMPOSITE WHITE LIGHT | | |
|---|---|---|---|---|---|---|---|
| PEAK WAVELENGTH (nm) | PEAK WAVELENGTH (nm) | HALF VALUE WIDTH (nm) | PEAK WAVELENGTH (nm) | HALF VALUE WIDTH (nm) | 4200K/Duv=−5 WHITE COLOR DETERMINATION | PS VALUE | PREFERENCE OF SKIN LOOK |
| 440 | 550 | 130 | 640 | 95 | ○ | 90 | GOOD |
| 455 | 545 | 130 | 640 | 95 | ○ | 95 | GOOD |
| 455 | 550 | 110 | 640 | 95 | ○ | 95 | GOOD |
| 455 | 550 | 130 | 630 | 95 | ○ | 94 | GOOD |
| 455 | 550 | 130 | 640 | 80 | ○ | 94 | GOOD |
| 455 | 550 | 130 | 640 | 95 | ○ | 97 | GOOD |
| 455 | 550 | 130 | 640 | 110 | ○ | 95 | GOOD |
| 455 | 550 | 150 | 650 | 95 | ○ | 95 | GOOD |
| 455 | 555 | 130 | 640 | 95 | ○ | 98 | GOOD |
| 465 | 550 | 130 | 640 | 95 | ○ | 97 | GOOD |
| 435 | 550 | 130 | 640 | 95 | × | 98 | WRONG |
| 455 | 540 | 130 | 640 | 95 | × | 88 | WRONG |
| 455 | 550 | 105 | 640 | 95 | × | 94 | WRONG |
| 455 | 550 | 130 | 625 | 95 | × | 95 | WRONG |
| 455 | 550 | 130 | 640 | 75 | × | 94 | WRONG |
| 455 | 550 | 130 | 640 | 115 | × | 94 | WRONG |
| 455 | 550 | 130 | 655 | 95 | × | 95 | WRONG |
| 455 | 550 | 155 | 640 | 95 | × | 95 | WRONG |
| 455 | 560 | 130 | 640 | 95 | × | 98 | WRONG |
| 470 | 550 | 130 | 640 | 95 | × | 98 | WRONG |

FIG. 4

| OUTPUT VALUES IN DIFFERENT WAVELENGTHS RELATIVE TO OUTPUT VALUE 100 IN WAVELENGTH 435-465 | | | RATIO OF 630 NM OUTPUT VALUE TO 530 NM OUTPUT VALUE | 4200K/Duv=-5 WHITE COLOR DETERMINATION | PS VALUE | PREFERENCE OF SKIN LOOK |
|---|---|---|---|---|---|---|
| 490nm | 530nm | 630nm | | | | |
| 46 | 59 | 75 | 80 | ○ | 96 | GOOD |
| 46 | 59 | 85 | 70 | × | 98 | WRONG |
| 46 | 59 | 95 | 63 | × | 99 | WRONG |
| 47 | 62 | 79 | 79 | ○ | 96 | GOOD |
| 48 | 62 | 85 | 73 | ○ | 97 | GOOD |
| 48 | 62 | 92 | 68 | × | 98 | WRONG |
| 49 | 65 | 82 | 79 | ○ | 96 | GOOD |
| 49 | 65 | 86 | 76 | ○ | 97 | GOOD |
| 49 | 65 | 89 | 73 | ○ | 97 | GOOD |
| 51 | 68 | 76 | 89 | × | 92 | WRONG |
| 51 | 68 | 80 | 86 | ○ | 93 | GOOD |
| 51 | 68 | 83 | 82 | ○ | 95 | GOOD |
| 51 | 68 | 86 | 79 | ○ | 96 | GOOD |
| 51 | 68 | 90 | 76 | ○ | 97 | GOOD |
| 51 | 68 | 93 | 74 | ○ | 97 | GOOD |
| 51 | 68 | 96 | 71 | × | 98 | WRONG |
| 53 | 71 | 84 | 85 | ○ | 93 | GOOD |
| 53 | 71 | 87 | 82 | ○ | 95 | GOOD |
| 53 | 71 | 90 | 79 | ○ | 96 | GOOD |
| 54 | 74 | 81 | 92 | × | 90 | WRONG |
| 54 | 74 | 87 | 85 | ○ | 93 | GOOD |
| 54 | 74 | 94 | 79 | ○ | 95 | GOOD |
| 56 | 77 | 78 | 98 | × | 87 | WRONG |
| 56 | 77 | 88 | 88 | × | 92 | WRONG |
| 56 | 77 | 98 | 79 | ○ | 95 | GOOD |

ILLUMINATION DEVICE HAVING IMPROVED VISUAL PERCEPTION OF A SKIN COLOR

FIELD OF THE INVENTION

The present invention relates to an illumination device.

BACKGROUND OF THE INVENTION

Among various kinds of illumination devices provided with LED elements, there is known an illumination device that places emphasis the high efficiency. The illumination device placing emphasis on the high efficiency is superior in light emission efficiency but inferior in color rendering property. It is also likely that the visual perception of the color of an object or a human skin irradiated by the light of the illumination device may become unfaithful.

In light of this, Japanese Patent Application Publication No. 2010-176992 discloses an illumination device placing emphasis on the high color rendering property. This illumination device takes into account, e.g., an average color rendering index Ra and a special color rendering index No. 15 (R15), in order to assure faithful visual perception of the color of an object or a human skin.

In the illumination device referred to above, the visual perception of a human skin color or the like is made faithful (the color rendering property is kept high) by increasing an average color rendering index Ra and a special color rendering index. No. 15 (R15). In recent years, a demand exists for an illumination device capable of not only having a skin color look faithful but also having the skin color look preferable.

SUMMARY OF THE INVENTION

In view of the above, the present invention provides an illumination device capable of suitably improving visual perception of a skin color or the like.

In accordance with an aspect of the present invention, there is provided an illumination device including: an irradiation unit for irradiating light, the irradiation unit including a light emitting element and a plurality of fluorescent bodies excited by the light coming from the light emitting element to radiate light of different wavelengths, wherein the irradiation unit is configured to irradiate composite light of blue light having a half value width of from 20 nm to 40 nm and a peak wavelength in a wavelength range of from 440 nm to 465 nm, green light having a half value width of from 110 nm to 150 nm and a peak wavelength in a wavelength range of from 545 nm to 555 nm and red light having a half value width of from 80 nm to 110 nm and a peak wavelength in a wavelength range of from 630 nm to 650 nm, wherein the irradiation unit is configured such that, if the output value of the light in a wavelength range of from 435 nm to 465 nm is assumed to be 100%, the output value of the light having a wavelength of 490 nm falls in a range of from 46% to 56%, the output value of the light having a wavelength of 530 nm falls in a range of from 59% to 77% and the output value of the light having a wavelength of 630 nm falls in a range of from 75% to 98%, and wherein the irradiation unit is configured such that the ratio of the output value of the light having a wavelength of 630 nm to the output value of the light having a wavelength of 530 nm falls in a range of from 73% to 36%.

The light emitting element may be an LED element for emitting the blue light having a half value width of from 20 nm to 40 nm and a peak wavelength in a wavelength range of from 440 nm to 465 nm, the fluorescent bodies including a fluorescent body for radiating the green light having a half value width of from 110 nm to 150 nm and a peak wavelength in a wavelength range of from 545 nm to 555 nm and a fluorescent body for radiating the red light having a half value width of from 80 nm to 110 nm and a peak wavelength in a wavelength range of from 630 nm to 650 nm.

The fluorescent body for radiating the green light may be made of cerium-activated calcium scandate.

Further, the fluorescent body for radiating the red light may be made of at least one of europium-activated calcium aluminum silicon nitride and europium-activated strontium calcium aluminum silicon nitride.

If the weight of the fluorescent body for radiating the green light is assumed to be 100%, the weight of the fluorescent body for radiating the red light may fail in a range of from 20% to 27%.

In accordance with the present invention, the illumination device can suitably improve visual perception of a skin color or the like.

BRIEF DESCRIPTION OF THE DRAWINGS

The objects and features of the present invention will become apparent from the following description of embodiments, given in conjunction with the accompanying drawings, in which:

FIG. 3 is a table for explaining the influence of a characteristic change of the monochromatic light; and FIG. 4 is a table for explaining the influence of an output value change of the composite white light in the respective wavelengths.

DETAILED DESCRIPTION OF THE PREFERRED EMBODIMENTS

One embodiment of the present invention will now be described in detail with reference the accompanying drawings which form a part hereof. Throughout the drawings, identical or similar portions will be designated by like reference symbols and redundant description thereof will be omitted.

Figure 1:
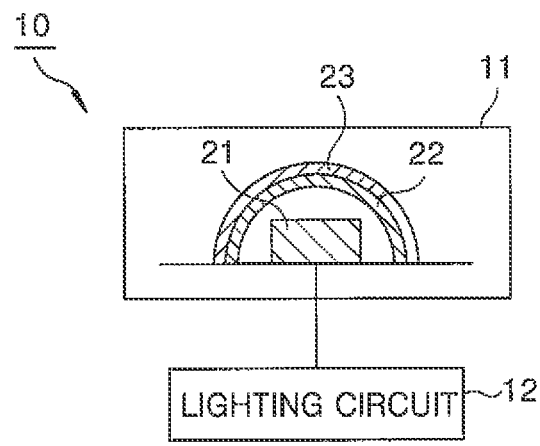
FIG. 1 is a schematic configuration diagram showing an illumination device according to one embodiment of the present invention.

As shown in FIG. 1, an illumination device 10 according to one embodiment of the present invention includes an irradiation unit 11 for irradiating light to the outside and a lighting circuit 12 for lighting the irradiation unit 11.

The irradiation unit 11 includes an LED element 21 electrically connected to the lighting circuit 12 and a plurality of fluorescent bodies 22 and 23 arranged to cover the light emission surface of the LED element 21 and excited by the light coming from the LED element 21 to radiate light of different wavelengths. As electric power is supplied from the lighting circuit 12, the irradiation unit 11 generates light having a substantially white color.

Next, description will be made on the irradiation unit 11 of the illumination device 10.

The present inventor has configured the irradiation unit 11 in consideration of whether the light irradiated from the irradiation unit 11 is in a range which can be regarded as substantially the same color as 4200 K, an intermediate color temperature of white light, and in view of the preference index PS of skin color of Japanese women (proposed by Yano Tadashi, et al.), an index indicating the preferable look of a human skin color. More specifically, the present inventor has conducted tests A and B as follows.

(Test A)

By appropriately changing the peak wavelength of the LED element 21 which emits blue light and the peak wavelength and half value width of the fluorescent bodies 22 and 23, it is determined whether the light irradiated from the irradiation unit 11 has substantially the same color as the light whose Duv indicating a color deviation (a deviation from a black body radiation locus) at a color temperature of 4200 K is −5. This determination is preferably performed on the basis of chromaticity ellipses defined by MacAdam and by use of 5SDCM (5 Standard Deviation of Color Matching) or 4SDCM which is a chromaticity permission range of various kinds of light source colors approved by TEC (International Electro-technical Commission). However, the determination is not limited to a particular method.

Further, appropriately chancing the peak wavelength of the LED element 21 which emits blue light, and the peak wavelength and half value width of the fluorescent bodies 22 and 23, the PS value, i.e., the preference index of skin color, is calculated with respect to the light irradiated from the irradiation unit 11. One method of calculating the PS value is disclosed in, e.g., Japanese Patent Application Publication No. H11-258047. In this method, the calculated evaluation value P on the preference of skin color is found and then the preference index of skin color PS is calculated from $4 \times 5^P$.

The light irradiated from the irradiation unit 11 is white light having substantially the same color as the light whose Duv indicating a color deviation (a deviation from a black body radiation locus) at a color temperature of 4200 K is −5. As shown in FIG. 3, the PS value of the light irradiated from the irradiation unit 11 is relatively high under the following conditions.

(Condition A1) The peak wavelength of blue light is 440 nm. The peak wavelength of green light is 550 nm and the half value width of green light is 1.30 nm. The peak wavelength of red light is 640 nm and the half value width of red light is 95 nm.

(Condition A2) The peak wavelength of blue light is 455 nm. The peak wavelength of green light is 545 nm and the half value width of green light is 130 nm. The peak wavelength of red light is 640 nm and the half value width of red light is 95 nm.

(Condition A3) The peak wavelength of blue light is 455 nm. The peak wavelength of green light is 550 nm and the half value width of green light is 110 nm. The peak wavelength of red light is 640 nm and the half value width of red light is 9.5 nm.

(Condition A4) The peak wavelength of blue light is 455 nm. The peak wavelength of green light is 550 nm and the half value width of green light is 130 nm. The peak wavelength of red light is 630 nm and the half value width of red light is 95 nm.

(Condition A5) The peak wavelength of blue light is 455 nm. The peak wavelength of green light is 550 nm and the half value width of green light is 130 nm. The peak wavelength of red light is 640 nm and the half value width of red light is 80 nm.

(Condition A6) The peak wavelength of blue light is 455 nm. The peak wavelength of green light is 550 nm and the half value width of green light is 130 nm. The peak wavelength of red light is 640 nm and the half value width of red light is 95 nm.

(Condition A7) The peak wavelength of blue light is 455 nm. The peak wavelength of green light is 550 nm and the half value width of green light is 130 nm. The peak wavelength of red light is 640 nm and the half value width of red light is 110 nm.

(Condition A8) The peak wavelength of blue light is 455 nm. The peak wavelength of green light is 550 nm and the half value width of green light is 130 nm. The peak wavelength of red light is 650 nm and the half value width of red light is 95 nm.

(Condition A9) The peak wavelength of blue light is 455 nm. The peak wavelength of green light is 550 nm and the half value width of green light is 150 nm. The peak wavelength of red light is 640 nm and the half value width of red light is 95 nm.

(Condition A10) The peak wavelength of blue light is 455 nm. The peak wavelength of green light is 555 nm and the half value width of green light is 130 nm. The peak wavelength of red light is 640 nm and the half value width of red light is 95 nm.

(Condition A11) The peak wavelength of blue light is 465 nm. The peak wavelength of green light is 550 nm and the half value width of green light is 130 nm. The peak wavelength of red light is 640 nm and the half value width of red light is 95 nm.

The following requirements can be derived from the respective conditions noted above. In other words, the blue light has a peak wavelength in a wavelength range of from 440 nm to 465 nm. The green light has a peak wavelength in a half value width range of from 110 nm to 150 nm and in a wavelength range of from 545 nm to 555 nm. The red light has a peak wavelength in a half value width range of from 80 nm to 110 nm and in a wavelength range of from 630 nm to 650 nm.

(Test B)

By appropriately changing the three kinds of wavelengths of the light of the irradiation unit 11 composed of the LED element 21 and the fluorescent bodies 22 and 23, it is determined whether the light irradiated from the irradiation unit 11 has substantially the same color as the light whose Duv indicating a color deviation (a deviation from a black body radiation locus) at a color temperature of 4200 K is −5. Then, by appropriately changing the three kinds of wavelengths of the light of the irradiation unit 11 composed of the LED element 21 and the fluorescent bodies 22 and 23, the PS value, i.e., the preference index of skin color, is calculated with respect to the light irradiated from the irradiation unit 11.

The light irradiated from the irradiation unit 11 is white light having substantially the same color as the light whose Duv indicating a color deviation (a deviation from a black body radiation locus) at a color temperature of 4200 K is −5. As shown in FIG. 4, the PS value of the light irradiated from the irradiation unit 11 is relatively high under the following conditions. The output values at the three kinds of wavelengths, i.e., the wavelength 490 nm, the wavelength 530 nm and the wavelength 630 nm, indicate the ratios under the assumption that the output value in the blue light wavelength of from 435 nm to 465 nm is 100%.

(Condition B1) The ratio of the wavelength 490 nm is 46%, the ratio of the wavelength 530 nm is 59%, and the ratio of the wavelength 630 nm is 75%. The ratio of the output value of the wavelength 630 nm to the output value of the wavelength 530 nm is 80%.

(Condition B2) The ratio of the wavelength 490 nm is 47%, the ratio of the wavelength 530 nm is 62%, and the ratio of the wavelength 630 nm is 79%. The ratio of the output value of the wavelength 630 nm to the output value of the wavelength 530 nm is 79%.

(Condition B3) The ratio of the wavelength 490 nm is 48%, the ratio of the wavelength 530 nm is 62%, and the ratio of the wavelength 630 nm is 85%. The ratio of the output value of the wavelength 630 nm to the output value of the wavelength 530 nm is 73%.

(Condition B4) The ratio of the wavelength 490 nm is 49%, the ratio of the wavelength 530 nm is 65%, and the ratio of the wavelength 630 nm is 82%. The ratio of the output value of the wavelength 630 nm to the output value of the wavelength 530 nm is 79%.

(Condition B5) The ratio of the wavelength 490 nm is 49%, the ratio of the wavelength 530 nm is 65%, and the ratio of the wavelength 630 nm is 86%. The ratio of the output value of the wavelength 630 nm to the output value of the wavelength 530 nm is 76%.

(Condition B6) The ratio of the wavelength 490 nm is 4%, the ratio of the wavelength 530 nm is 65%, and the ratio of the wavelength 630 nm is 89%. The ratio of the output value of the wavelength 630 nm to the output value of the wavelength 530 nm is 73%.

(Condition B7) The ratio of the wavelength 490 nm is 51%, the ratio of the wavelength 530 nm is 68%, and the ratio of the wavelength 630 nm is 80%. The ratio of the output value of the wavelength 630 nm to the output value of the wavelength 530 nm is 86%.

(Condition B8) The ratio of the wavelength 490 nm is 51%, the ratio of the wavelength 530 nm is 68%, and the ratio of the wavelength 630 nm is 83%. The ratio of the output value of the wavelength 630 nm to the output value of the wavelength 530 nm is 82%.

(Condition B9) The ratio of the wavelength 490 nm is 51%, the ratio of the wavelength 530 nm is 68%, and the ratio of the wavelength 630 nm is 86%. The ratio of the output value of the wavelength 630 nm to the output value of the wavelength 530 nm is 79%.

(Condition B10) The ratio of the wavelength 490 nm is 51%, the ratio of the wavelength 530 nm is 68%, and the ratio of the wavelength 630 nm is 90%. The ratio of the output value of the wavelength 630 nm to the output value of the wavelength 530 nm is 76%.

(Condition B11) The ratio of the wavelength 490 nm is 51%, the ratio of the wavelength 530 nm is 68%, and the ratio of the wavelength 630 nm is 93%. The ratio of the output value of the wavelength 630 nm to the output value of the wavelength 530 nm is 74%.

(Condition B12) The ratio of the wavelength 490 nm is 53%, the ratio of the wavelength 530 nm is 71%, and the ratio of the wavelength 630 nm is 84%. The ratio of the output value of the wavelength 630 nm to the output value of the wavelength 530 nm is 85%.

(Condition B13) The ratio of the wavelength 490 nm is 53%, the ratio of the wavelength 530 nm is 71%, and the ratio of the wavelength 630 nm is 87%. The ratio of the output value of the wavelength 630 nm to the output value of the wavelength 530 nm is 82%.

(Condition B14) The ratio of the wavelength 490 nm is 53%, the ratio of the wavelength 530 nm is 71%, and the ratio of the wavelength 630 nm is 90%. The ratio of the output value of the wavelength 630 nm to the output value of the wavelength 530 nm is 79%.

(Condition B15) The ratio of the wavelength 490 nm is 54%, the ratio of the wavelength 530 nm is 74%, and the ratio of the wavelength 630 nm is 87%. The ratio of the output value of the wavelength 630 nm to the output value of the wavelength 530 nm is 85%.

(Condition B16) The ratio of the wavelength 490 nm is 54%, the ratio of the wavelength 530 nm is 74%, and the ratio of the wavelength 630 nm is 94%. The ratio of the output value of the wavelength 630 nm to the output value of the wavelength 530 nm is 79%.

(Condition B17) The ratio of the wavelength 490 nm is 56%, the ratio of the wavelength 530 nm is 77%, and the ratio of the wavelength 630 nm is 98%. The ratio of the output value of the wavelength 630 nm to the output value of the wavelength 530 nm is 79%.

The following requirements can be derived from the respective conditions noted above. More specifically, if the output value of the light in a wavelength range of from 435 nm to 465 nm is assumed to be 100%, the output value of the light having a wavelength of 490 nm is in a range of from 46% to 56%. The output value of the light having a wavelength of 530 nm is in a range of from 59% to 77%. The output value of the light having a wavelength of 630 nm is in a range of from 75% to 98%. The ratio of the output value of the light having a wavelength of 630 nm to the output value of the light having a wavelength of 530 nm is from 73% to 86%.

Figure 2:
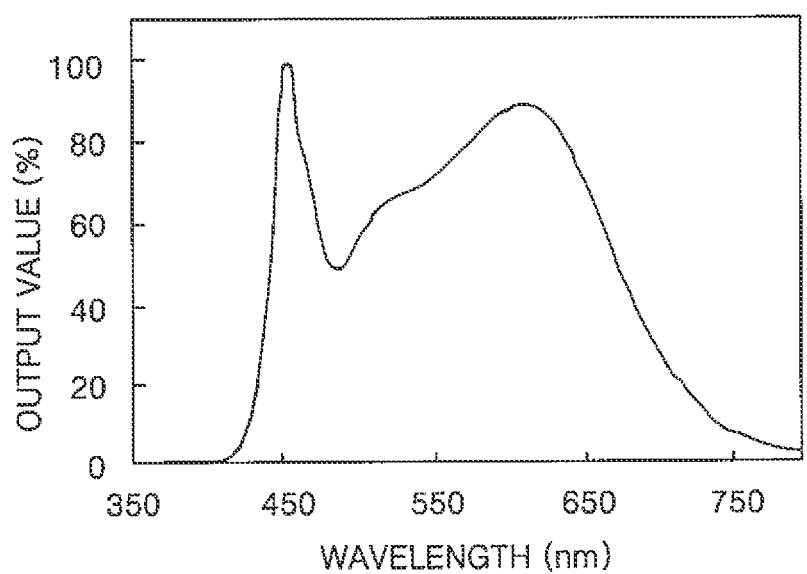
FIG. 2 is a waveform diagram for explaining one example of output value characteristics of the light of an irradiation unit.

In the present embodiment, the irradiation unit 11 having, e.g., the output characteristics shown in FIG. 2, is configured on the basis of the requirements derived through the tests A and B.

More specifically, the LED element 21 of the irradiation unit 11 employs an LED that emits blue light having an emission center wavelength (peak wavelength) of 455 nm and a half value width of 30 nm. The fluorescent bodies 22 and 23 of the irradiation unit 11 include a fluorescent body 22 for receiving light from the LED element 21 and radiating green light and a fluorescent body 23 for receiving light from the LED element 21 and radiating red light. The fluorescent body 22 for radiating green light is made of cerium-activated calcium scandate ($CaSc_2O_4$:Ce) which can radiate green light having a half value width of 130 nm and a peak wavelength of 550 nm. The fluorescent body 23 for radiating red light is made of a mixture of europium-activated calcium aluminum silicon nitride ($CaAlSiN_3$:Eu) and europium-activated strontium calcium aluminum silicon nitride ($(Sr,Ca)AlSiN_3$:Eu) which can radiate red light having a half value width of 95 nm and a peak wavelength of 640 nm.

The fluorescent body 22 for radiating green light and the fluorescent body 23 for radiating red light are one-piece formed by mixing them in a weight ratio of 100:23 and dispersing them within a silicon resin.

The irradiation unit 11 is configured such that, if the output value of the blue light having a peak at a wavelength of 455 nm is assumed to be 100%, the output value of the light having a wavelength of 490 nm becomes equal to 51%, the output value of the light having a wavelength of 530 nm becomes equal to 68% and the output value of the light having a wavelength of 630 nm becomes equal to 86%. In addition, the irradiation unit 11 is configured such that the ratio of the output value of the light having a wavelength of 630 nm to the output value of the light having a wavelength of 530 nm becomes equal to 79%.

Next, description will be made on the operation (operation example) of the present embodiment.

In the illumination device 10 of the present embodiment, blue light is emitted from the LED element 21 of the irradiation unit 11 through the lighting circuit 12. The blue light is partially absorbed by the fluorescent bodies 22 and 23 which in turn radiate light of longer wavelength (red light and green light). The irradiation unit 11 combines the blue light, the green light and the red light and irradiates white light having a color temperature of about 4200 K and a Duv of −5. The preference index of skin color PS of the white light is 96.

Next, description will be made on the characterizing effects of the present embodiment.

(1) The irradiation unit 11 includes the LED element 21 radiating blue light and having a half value width of 30 nm and a peak at a wavelength of 455 nm, the fluorescent body 22 having a half value width of 130 nm and a peak at a wavelength of 550 nm, and the fluorescent body 23 having a half value width of 95 nm and a peak at a wavelength of 640 nm. Moreover, the irradiation unit 11 is configured such that, if the output value of the blue light having a peak at a wavelength of 455 nm is assumed to be 100%, the output value of the light having a wavelength of 490 nm becomes equal to 51%, the output value of the light having a wavelength of 530 nm becomes equal to 68% and the output value of the light having a wavelength of 630 nm becomes equal to 86%. In addition, the irradiation unit 11 is configured such that the ratio of the output value of the light having a wavelength of 630 nm to the output value of the light having a wavelength of 530 nm becomes equal to 79%. With this configuration, it is possible to realize the light whose color temperature is about 4200 K, whose color deviation Duv is −5 and whose preference index of skin color PS is 96. This makes a human skin look preferable under warm white light source widely used in commercial facilities. Due to the preferable look of the human skin, a woman looks beautiful and an aged person or a patient looks healthy. This helps cheer the people up, thereby making the people pleasant. If the illumination, device 10 is used in a studio or a stage, the skin of a human as a subject looks preferable and this makes it possible to take a beautiful image.

(2) Since the fluorescent body 22 for radiating green light is made of cerium-activated calcium scandate, the aging deterioration of the fluorescent body 22 caused by the environmental loads (temperature and humidity) becomes low. This helps increase the durability of the fluorescent body 22, thus making the human skin look preferable in a stable manner.

(3) The fluorescent body 23 for radiating red light is formed by mixing europium-activated calcium aluminum silicon nitride and europium-activated strontium calcium aluminum silicon nitride. In this regard, the europium-activated calcium aluminum silicon nitride and the europium-activated strontium calcium aluminum silicon nitride are low in the aging deterioration caused by the environmental loads (temperature and humidity). Use of such materials helps increase the durability of the fluorescent body 23, thus making the human skin look preferable in a stable manner.

(4) By combining the fluorescent body 22 for radiating green light and the fluorescent body 23 for radiating red light such that the ratio of the weight of the fluorescent body 23 to the weight of fluorescent body 22 becomes equal to 23%, it is possible to stably realize a highly-efficient illumination device 10 for irradiating the light whose color temperature is about 4200 K, whose color deviation Duv is −5 and whose preference index of skin color PS is 95.

(5) Inasmuch as the LED element 21 is used as a light source, it is possible to save energy as compared with a case where a fluorescent lamp or a incandescent lamp is used as a light source.

The embodiment of the present invention may be modified as follows.

In the embodiment described above, the LED element 21 is configured to have a half value width of 30 nm and a peak at a wavelength of 455 nm. However, the present invention is not limited thereto. The LED element 21 may be configured to have a half value width of from 20 nm to 40 nm and a peak in a wavelength range of from 440 nm to 465 nm. It is preferred that the LED element 21 be configured to have a peak in a wavelength range of from 445 nm to 460 nm.

In the embodiment described above, the fluorescent body 22 for radiating green light is configured to have a half value width of 130 nm and a peak at a wavelength of 550 nm. However, the present invention is not limited thereto. The fluorescent body 22 may be configured to have a half value width of from 110 nm to 150 nm and a peak in a wavelength range of from 545 nm to 555 nm. It is preferred that the fluorescent body 22 be configured to have a half value width of from 120 nm to 140 nm and a peak in a wavelength range of from 547 nm to 553 nm.

In the embodiment described above, the fluorescent body 23 for radiating red light is configured to have a half value width of 95 nm and a peak at a wavelength of 640 nm. However, the present invention is not limited thereto. The fluorescent body 23 may be configured to have a half value width of from 80 nm to 100 nm and a peak in a wavelength range of from 630 nm to 650 nm. It is preferred that the fluorescent body 23 be configured to have a half value width of from 80 nm to 110 nm and a peak in a wavelength range of from 635 nm to 645 nm.

In the embodiment described above, cerium-activated calcium scandate is employed as the fluorescent body 22 for radiating green light. However, the present invention is not limited thereto. As alternative example, the fluorescent body 22 may be a europium-activated silicate-based fluorescent body, a cerium-activated silicate-based fluorescent body, a cerium-activated aluminate-based fluorescent body, a cerium-activated scandate-based fluorescent body, a europium-activated oxynitride fluorescent body or a europium-activated thiogallate-based fluorescent body In the embodiment described above, a mixture of europium-activated calcium aluminum silicon nitride and europium-activated strontium calcium aluminum silicon nitride is employed as the fluorescent body 23 for radiating red light. However, the present, invention, is not limited thereto. As an alternative example, the fluorescent, body 23 may be configured to include at least one of europium-activated calcium aluminum silicon nitride and europium-activated strontium calcium aluminum silicon nitride. In addition, the fluorescent body 23 may be a europium-activated nitride-based fluorescent body, a europium-activated oxynitride-based fluorescent body, a europium-activated sulfide-based fluorescent body or a europium-activated silicate-based fluorescent body.

In the embodiment described above, the irradiation unit 11 is configured such that, if the output value of the light having a peak at a wavelength of 455 nm is assumed to be 100%, the output value of the light having a wavelength of 490 nm becomes equal to 51%, the output value of the light having a wavelength of 530 nm becomes equal to 68% and the output value of the light having a wavelength of 630 nm becomes equal to 86%. However, the present invention is not limited thereto. The irradiation unit 11 may be configured such that if the output value of the light having a peak in a wavelength range of from 435 nm to 465 nm is assumed to be 100%, the output value of the light having a wavelength of 490 nm falls in a range of from 46% to 56%, the output value of the light having a wavelength of 530 nm falls in a range of from 59% to 77% and the output value of the light having a wavelength of 630 nm falls in a range of from 75% to 98%. The irradiation unit 11 may be configured such that the ratio of the output value of the light having a wavelength of 630 nm to the output value of the light having a wavelength of 530 nm falls in a range of from 73% to 86%. The fluorescent body 22 for radiating green light and the fluorescent body 23 for radiating red light may be one-piece formed by mixing them in a weight ratio of 100:20-27 and dispersing them within a silicon resin.

in the embodiment described above, the LED element 21 is used as a light emitting element. However, the present invention is not limited thereto. It may be possible to employ a configuration that makes use of an organic electro-luminescence element or other light emitting elements.

While the invention has been shown and described with respect to the embodiments, it will be understood by those skilled in the art that various changes and modification may be made without departing from the scope of the invention as defined in the following claims.

What is claimed is:

1. An illumination device, comprising:

an irradiation unit for irradiating light, the irradiation unit including a light emitting element and a plurality of fluorescent bodies excited by the light coming from the light emitting element to radiate light of different wavelengths, wherein the irradiation unit is configured to irradiate composite light of blue light having a half value width of from 20 nm to 40 nm and a peak wavelength in a wavelength range of from 440 nm to 465 nm, green light having a half value width of from 110 nm to 150 nm and a peak wavelength in a wavelength range of from 545 nm to 555 nm and red light having a half value width of from 80 nm to 110 nm and a peak wavelength in a wavelength range of from 630 nm to 650 nm, wherein the irradiation unit is configured such that, if the output value of the light in a wavelength range of from 435 nm to 465 nm is assumed to be 100%, the output value of the light having a wavelength of 490 nm falls in a range of from 46% to 56%, the output value of the light having a wavelength of 530 nm fails in a range of from 59% to 77% and the output value of the light having a wavelength of 630 nm falls in a range of from 75% to 98%, and wherein the irradiation unit is configured such that the ratio of the output value of the light having a wavelength of 630 nm to the output value of the light having a wavelength of 530 nm falls in a range of from 73% to 86%.

2. The device of claim 1, wherein the light emitting element is an LED element for emitting the blue light having a half value width of from 20 nm to 40 nm and a peak wavelength in a wavelength range of from 440 nm to 465 nm, the fluorescent bodies including a fluorescent body for radiating the green light having a half value width of from 110 nm to 150 nm and a peak wavelength in a wavelength range of from 545 nm to 555 nm and a fluorescent body for radiating the red light having a half value width of from 80 nm to 110 nm and a peak wavelength in a wavelength range of from 630 nm to 650 nm.

3. The device of claim 2, wherein the fluorescent body for radiating the green light is made of cerium-activated calcium scandate.

4. The device of claim 2, wherein the fluorescent body for radiating the red light is made of at least one of europium-activated calcium aluminum silicon nitride and europium-activated strontium calcium aluminum silicon nitride.

5. The device of claim 2, wherein, if the weight of the fluorescent body for radiating the green light is assumed to be 100%, the weight of the fluorescent body for radiating the red light falls in a range of from 20% to 27%.

* * * * *